(12) United States Patent
Donahue (10) Patent No.: US 11,567,411 B2
(45) Date of Patent: Jan. 31, 2023

(54) MASKLESS PHOTOLITHOGRAPHY DEVICES, METHODS, AND SYSTEMS

(71) Applicant: NanoPath, Inc., Leominster, MA (US)

(72) Inventor: Kevin Donahue, Harvard, MA (US)

(73) Assignee: NANOPATH, INC., Leominster, MA (US)

(*) Notice: Subject to any disclaimer, the term of this patent is extended or adjusted under 35 U.S.C. 154(b) by 0 days.

(21) Appl. No.: 17/041,756

(22) PCT Filed: Mar. 27, 2019

(86) PCT No.: PCT/US2019/024434
§ 371 (c)(1),
(2) Date: Sep. 25, 2020

(87) PCT Pub. No.: WO2019/191333
PCT Pub. Date: Oct. 3, 2019

(65) Prior Publication Data
US 2021/0124271 A1    Apr. 29, 2021

Related U.S. Application Data (60) Provisional application No. 62/648,780, filed on Mar. 27, 2018.

(51) Int. Cl.
*G03F 7/20* (2006.01)
*F21V 8/00* (2006.01)
(Continued)

(52) U.S. Cl.
CPC .......... *G03F 7/7035* (2013.01); *G02B 6/0011* (2013.01); *G02B 6/0035* (2013.01);
(Continued)

(58) Field of Classification Search
CPC . G03F 7/7035; G03F 1/50; G03F 7/16; G03F 7/2004; G03F 7/2051; G03F 7/26;
(Continued)

(56) References Cited

U.S. PATENT DOCUMENTS 6,171,730 B1   1/2001   Kuroda et al.
6,395,435 B1   5/2002   Cowen et al.
(Continued)

FOREIGN PATENT DOCUMENTS

EP      1 001 311 A1      5/2000
JP      10-048810 A       2/1998
WO      WO-2006/114369 A2  11/2006

OTHER PUBLICATIONS

Foreign Search Report on PCT PCT/US2019/024434 dated Oct. 8, 2020.
(Continued)

*Primary Examiner* — Mesfin T Asfaw
(74) *Attorney, Agent, or Firm* — Christopher J. McKenna; Foley & Lardner LLP (57) ABSTRACT

A device (100) includes a light source (130) and a light guide (110). The light source (130) is configured to emit photoresist-curative electromagnetic radiation. The light guide (110) is arranged to receive the photoresist-curative electromagnetic radiation from the light source (130) and to guide the received radiation by total internal reflection, the light guide (110) including a pattern of emission points (210) on at least one surface of the light guide (110), the emission points (210) emitting the photoresist-curative electromagnetic radiation out of the light guide (110) by frustration of total internal reflection caused by the emission points (210).

19 Claims, 5 Drawing Sheets

(51) Int. Cl.
*G03F 7/16* (2006.01)
*G03F 7/26* (2006.01)
*G03F 1/50* (2012.01)
*H01L 21/027* (2006.01)

(52) U.S. Cl.
CPC ......... *G02B 6/0036* (2013.01); *G02B 6/0051* (2013.01); *G03F 1/50* (2013.01); *G03F 7/16* (2013.01); *G03F 7/2004* (2013.01); *G03F 7/2051* (2013.01); *G03F 7/26* (2013.01); *G03F 7/7015* (2013.01); *G03F 7/70108* (2013.01); *G03F 7/70283* (2013.01); *H01L 21/0274* (2013.01)

(58) Field of Classification Search
CPC ............... G03F 7/70108; G03F 7/7015; G03F 7/70283; G02B 6/0011; G02B 6/0035; G02B 6/0036; G02B 6/0051; G02B 6/0068; G02B 6/008; G02B 27/0172; G02B 6/0076; G02B 6/005; G02B 6/0018; H01L 21/0274; G02C 11/10
See application file for complete search history.

(56) References Cited

U.S. PATENT DOCUMENTS

| | | |
|---|---|---|
| 2004/0090610 A1 | 5/2004 | Hatakeyama et al. |
| 2004/0115568 A1 | 6/2004 | Schmidt |
| 2009/0080215 A1* | 3/2009 | Anandan ................ G02B 6/005 |
| | | 362/606 |
| 2009/0317727 A1 | 12/2009 | Beck |
| 2012/0140436 A1* | 6/2012 | Yang ...................... F21V 13/02 |
| | | 362/84 |
| 2013/0141937 A1* | 6/2013 | Katsuta ................. G02B 6/003 |
| | | 362/606 |
| 2015/0348793 A1 | 12/2015 | Wang |
| 2019/0302346 A1 | 10/2019 | Donahue |

OTHER PUBLICATIONS

International Search Report and Written Opinion of the International Searching Authority dated Jun. 19, 2019 for International Application PCT/US2019/024434 (21 pages).
Non-Final Office Action on U.S. Appl. No. 16/366,600 dated Oct. 21, 2019.

* cited by examiner

MASKLESS PHOTOLITHOGRAPHY DEVICES, METHODS, AND SYSTEMS

RELATED APPLICATIONS

This application is a US National Phase of and claims priority to International Application Serial No. PCT/US2019/024434, filed Mar. 27, 2019, entitled "MASKLESS PHOTOLITHOGRAPHY DEVICES, METHODS AND SYSTEMS," which claims priority to U.S. Provisional Application Ser. No. 62/648,780 filed Mar. 27, 2018, entitled "MASKLESS PHOTOLITHOGRAPHY DEVICES, METHODS AND SYSTEMS," incorporated by reference herein in its entirety.

FIELD OF DISCLOSURE

Systems and methods are described for general illumination for displaying illuminable patterns using maskless photography.

BACKGROUND

Photolithography is commonly used to produce semiconductors and nanoscale devices. The process generally involves the application, exposure and development of a photoresist that has been applied to the surface of a substrate, such as a silicon wafer. The exposure step in the photolithography process requires the application of a photoresist-curative light pattern to the surface of the photoresist to cure portions of the photoresist which have been exposed to the photoresist-curative. The light exposed photoresist is then developed to create patterned photoresist with voids therein. The patterned photoresist facilitates further processing such as the deposition of target materials such as dopant, metal, or metal oxide. The photoresist-curative light is often ultraviolet, which is used to selectively contact the photoresist-coated surface via the use of a writing beam, a projected image, or exposure through a patterned photomask.

A limitation in building devices that contain multiple layers of material deposited by photolithography is registration between layers and registration area limitations, i.e. the inability to accurately register features across a wide area. Typically a new layer of a device being built should have features registered with corresponding features on the currently top layer of the device. For example, according to one process, a registration limitation would be needed to cap a sub-micron scale optical feature with a metallic layer formed thereon, which requires the application and patterning of a photoresist that accurately creates a void above the area to be metalized. Features of the metallic layer should be registered with corresponding features of the sub-micron scale optical feature over the entire area of the device.

SUMMARY

According to the inventive concepts disclosed herein there is provided a device. The device includes a light source and a light guide. The light source is configured to emit photoresist-curative electromagnetic radiation. The light guide is arranged to receive the photoresist-curative electromagnetic radiation from the light source and to guide the received radiation by total internal reflection, the light guide including a pattern of emission points on at least one surface of the light guide, the emission points emitting the photoresist-curative electromagnetic radiation out of the light guide by frustration of total internal reflection caused by the emission points.

According to an aspect of the inventive concepts disclosed herein, the photoresist-curative electromagnetic radiation is ultraviolet (UV) light.

According to an aspect of the inventive concepts disclosed herein, the emission points comprise a light diffusing layer or a lens imprinted on the at least one surface of the light guide.

According to an aspect of the inventive concepts disclosed herein, the device further includes a photoresist disposed on a first surface of the light guide, the emission points formed on the first surface, wherein portions of the photoresist material are cured by the photoresist-curative electromagnetic radiation emitted at the emission points.

According to an aspect of the inventive concepts disclosed herein, the photoresist has an index of refraction less than that of the light guide so that the photoresist acts as an optical cladding to totally internally reflect the photoresist-curative electromagnetic radiation at the interface between the light guide, other than at the emission points, and the photoresist.

According to an aspect of the inventive concepts disclosed herein, the emission points include a roughened surface of the at least one surface.

According to an aspect of the inventive concepts disclosed herein, the emission points include an implanted region of the at least one surface.

According to an aspect of the inventive concepts disclosed herein, the emission points include a deposited light diffusing region adjacent the at least one surface.

According to an aspect of the inventive concepts disclosed herein, the deposited light diffusing region includes a metal oxide.

According to an aspect of the inventive concepts disclosed herein, the light source is arranged to the inject the photoresist-curative electromagnetic radiation into an edge of the light guide.

According to an aspect of the inventive concepts disclosed herein, the device further includes a photoresist disposed on a first surface of the light guide, the emission points formed on a second surface of the light guide opposite to the first surface, wherein portions of the photoresist material are cured by the photoresist-curative electromagnetic radiation emitted at the emission points.

According to the inventive concepts disclosed herein there is provided a device. The device includes a light source and a light guide. The light source is configured to emit photoresist-curative electromagnetic radiation. The light guide is arranged to receive the photoresist-curative electromagnetic radiation from the light source and to guide the received radiation by total internal reflection, the light guide including a film on at least one surface of the light guide, the film having a pattern of emission points, the emission points emitting the photoresist-curative electromagnetic radiation out of the light guide by frustration of total internal reflection caused by the emission points.

According to an aspect of the inventive concepts disclosed herein, the photoresist-curative electromagnetic radiation is ultraviolet (UV) light. According to an aspect of the inventive concepts disclosed herein, the film has an index of refraction less than that of the light guide so that the film acts as an optical cladding to totally internally reflect the photoresist-curative electromagnetic radiation at the interface between the film, other than at the emission points, and the film.

According to an aspect of the inventive concepts disclosed herein, the device further includes a photoresist disposed on a first surface of the light guide, the emission points formed on the film on the first surface, wherein portions of the photoresist material are cured by the photoresist-curative electromagnetic radiation emitted at the emission points.

According to an aspect of the inventive concepts disclosed herein, the device further includes a photoresist disposed on a first surface of the light guide, the emission points formed on the film on a second surface of the light guide opposite to the first surface, wherein portions of the photoresist material are cured by the photoresist-curative electromagnetic radiation emitted at the emission points.

According to an aspect of the inventive concepts disclosed herein, the light source is arranged to the inject the photoresist-curative electromagnetic radiation into an edge of the light guide.

According to the inventive concepts disclosed herein there is provided a method for exposing photoresist to photoresist-curative electromagnetic radiation. The photoresist is disposed on a first surface of a light guide, the light guide having a pattern of emission points. Photoresist-curative electromagnetic radiation is injected into the light guide such that the photoresist-curative electromagnetic radiation is guided within the light guide by total internal reflection, the emission points emitting the photoresist-curative electromagnetic radiation into the photoresist by frustration of total internal reflection caused by the emission points. The photoresist is developed to form a patterned photoresist.

According to an aspect of the inventive concepts disclosed herein, the photoresist-curative electromagnetic radiation is injected into an edge of the light guide.

According to an aspect of the inventive concepts disclosed herein, the photoresist-curative electromagnetic radiation is ultraviolet (UV) light.

According to an aspect of the inventive concepts disclosed herein, the emission points comprise a light diffusing layer or a lens imprinted on the first surface of the light guide.

According to an aspect of the inventive concepts disclosed herein, the method further comprises forming a patterned reflective layer on the light guide using the patterned photoresist.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

According to at least one embodiment, an optical substrate with a light-emitting surface pattern is deployed to enable maskless photolithography, which eliminates some registration limitations while providing the ability to register nanoscale features across a wide area, for example areas greater than 500 square inches. For example, the maskless photolithography may include providing a pattern on the optical substrate, and introducing photo-curative light into the substrate to selectively expose a photoresist to photo-curative light based on the pattern on the optical substrate.

The optical substrate may be part of displays that emit light, including ultra-high definition displays, multi-layer displays, and displays that feature transparent illumination. The optical substrate may be part of a nanoscale electronic device, as another example.

Figure 1A:
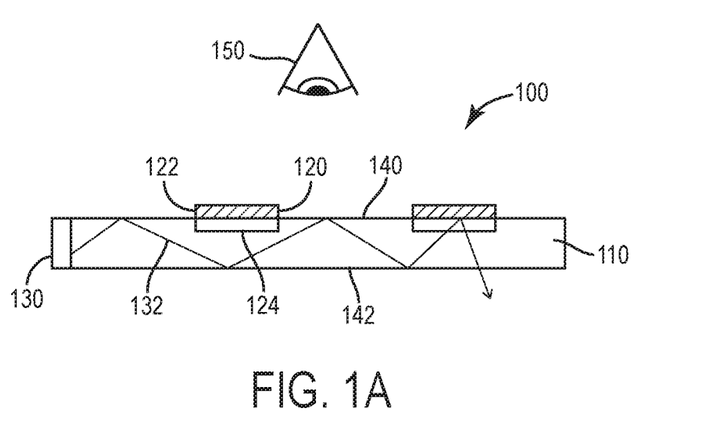
FIG. 1A is side view of an illumination device according to the inventive concepts disclosed herein.
Figure 1B:
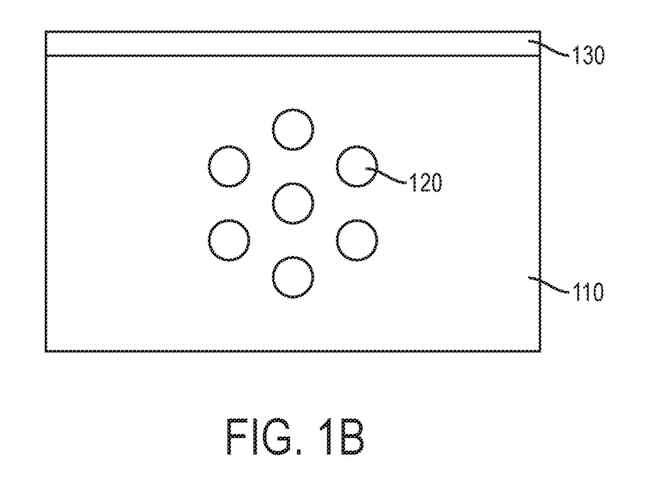
FIG. 1B is a top view of the illumination device of FIG. 1A.

The display formed may be, for example, a one-way see-through illumination device which may be formed according to at least one embodiment. FIG. 1A is a side view illustrating a one-way see-through illumination device 100 formed by a method according to at least one embodiment. FIG. 1B is a top view of the one-way see-through illumination device 100 of FIG. 1A. The illumination device 100 includes a light guide 110, a light source 130, and a pattern of pixels 120 on a surface 140 of the light guide 110. Each the pattern of pixels 120 includes a light diffusing layer 124 and a light reflecting layer 122. The illumination device 100 further includes a surface 142 of the light guide opposite to the surface 140. The surface 140 may be referred to as the front surface, while the surface 142 may be referred to as the back surface.

Some of the light, but not all, originally emitted from the light source 130 is ultimately directed to the back surface 142 and exits the back surface 142. On the other hand, light originally emitted from the light source 130 which is directed to the front surface 140 is totally internally reflected and does not exit the front surface 140. Thus, the eye 150 of a viewer which is on the side of the back surface 142 is able to view light originating from the light source 130 and injected into the light guide 110. On the other hand, the eye 150 of a viewer, if the eye 150 is on the side of the front surface 140, is not able to view light originating from the light source 130 and injected into the light guide 110. Thus, the light originating from the light source 130 and injected into the light guide 110 appears to be invisible from the front surface 140.

A light ray 132 is emitted from the light source 130 and directed into the light guide 110 at an angle such that the light ray 132 impinging on the front surface 140 or back source 142 undergoes total internal reflection, and the light ray 132 stays within the light guide 110. The light diffusing layer 124 may be chosen to be made of a light diffusing material which has an index of refraction such that when the light ray 132 originally emitted from the light source 130 impinges on the light diffusing layer 124, total internal reflection does not occur, and the light ray 132 is transmitted into the light diffusing layer 124. The light ray 132 transmitted into the light diffusing layer 124 is diffused and impinges on the light reflecting layer 122, where the light ray 132 is reflected back into the light diffusing layer 124 and is further diffused. The reflected and diffused light from the light diffusing layer 124 then exits the light diffusing layer 124, and impacts the back surface 142 at less than the critical angle such that the light exits the light guide 110, and can be seen.

The one-way see-through illumination device 100 may be formed using maskless techniques according to at least one embodiment.

According to at least one embodiment, a device is provided for the emission of photoresist-curative electromagnetic radiation by frustration of total internal reflection in an optical substrate, a light guide, caused by a pattern of emission points. At the pattern of emission points, the photoresist-curative electromagnetic radiation changes direction so that it may impinge upon a photoresist as part of photolithography process. The light guide may be an optically clear (light transmissive) substrate, such as glass or a transparent plastic. For example, the light guide may be PMMA (acrylic), PETG, PS (polystyrene), or PC (polycarbonate).

An initial step in the subject photolithography process is the formation of emission points. The emission points may be permanent or temporary, and may be light refracting, light diffusing, or light reflecting, where the emission points may be on at least one surface of light guide. The pattern of emission points may be used to frustrate photoresist-curative light, which is present within the light guide due to total internal reflection. In this regard, the photoresist-curative light is edge-injected into the light guide and redirected so that it is emitted onto the surface of the photoresist.

The emission points may be of a material, and/or geometry, that causes a portion of the photoresist-curative light within the light guide to exceed the critical angle needed to maintain total internal reflection. As a result, the photoresist receives the photoresist-curative light at regions directly above the pattern of light emissive points, and the photoresist may be developed to form a pattern of voids in the photoresist at regions corresponding to the light emissive points. The photoresist may be a negative photoresist or positive photoresist, for example.

Figure 2A:
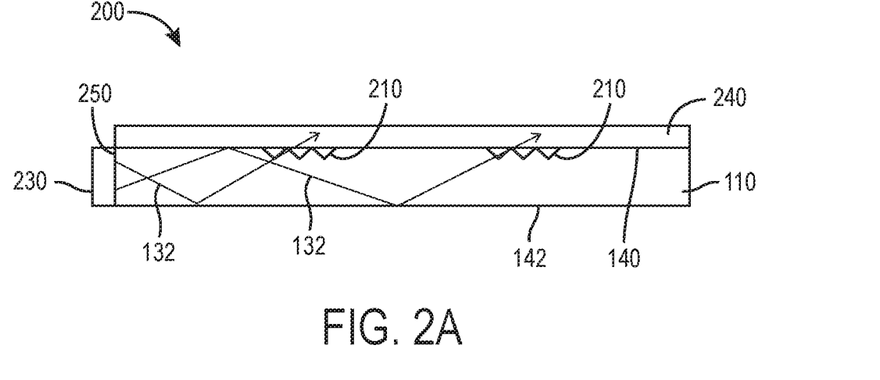
FIG. 2A is side view of a device providing emission of photo-curative electromagnetic radiation with emission points according to the inventive concepts disclosed herein.

FIG. 2A illustrates a device 200 that provides for the emission of photoresist-curative electromagnetic radiation by frustration of total internal reflection caused by a pattern of emission points, where the photoresist-curative electromagnetic radiation may impinge upon a photoresist.

The device 200 includes a light guide 110. The light guide 110 includes a pattern of emission points 210. The emission points 210 may be light refracting, light diffusing, or light reflecting, for example. For example, the pattern of light emission points 210 may be a light diffusing layer 124 as shown in FIG. 1.

Referring to FIG. 2A, the light device 200 further includes a light source 230 configured to emit photoresist-curative electromagnetic radiation. The light guide 110 is arranged to receive the photoresist-curative electromagnetic radiation from the light source 230 and to guide the received radiation by total internal reflection. The light guide 110 includes a pattern of emission points 210 on at least one surface of the light guide 110.

Figure 2B:
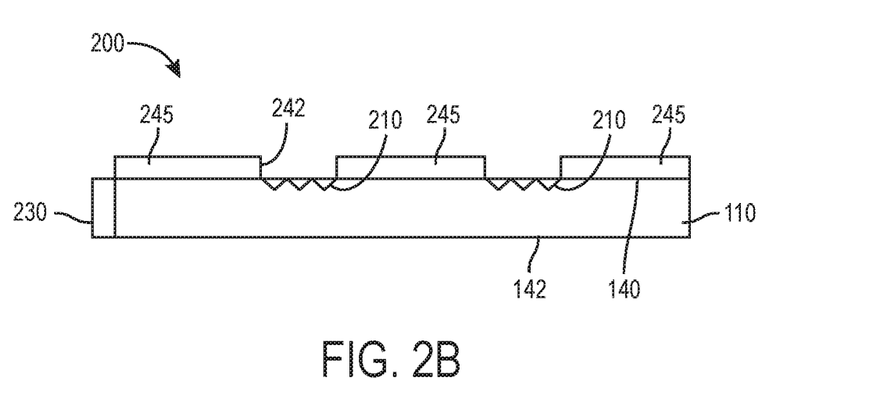
FIG. 2B is side view of a device providing emission of photo-curative electromagnetic radiation with emission points and a patterned photoresist according to the inventive concepts disclosed herein.

The emission points 210 emit the photoresist-curative electromagnetic radiation by frustration of total internal reflection caused by the emission points 210. A light ray 132 is emitted from the light source 230 and directed into the light guide 110 at an angle such that the light ray 132 impinging on a front surface 140 or back surface 142 of the light guide undergoes total internal reflection, and the light ray 132 stays within the light guide 110. The light source 210 may direct photoresist-curative electromagnetic radiation into the light guide 110 by edge injection into an edge 250 of the light guide 110. If the emission points 210 are part of a light diffusing layer 124, the light diffusing layer 124 may be chosen to be made of a light diffusing material which has an index of refraction such that when the light ray 132 originally emitted from the light source 130 impinges on an emission points 210, total internal reflection does not occur, and the light ray 132 exits the light guide 110 at the emission points 210. The exiting light ray 132 impinges on corresponding regions of a photoresist 240 disposed on the light guide 110. The photoresist 240 is then developed to form a patterned photoresist 245 as shown in FIG. 2B, where the patterned photoresist 245 has a pattern of wells 242 formed in the patterned photoresist 245 exposing the light guide 110. The photoresist 240 may have an index of refraction less than that of the light guide 110 so that the photoresist 240 acts as an optical cladding to totally internally reflect the photoresist-curative electromagnetic radiation at the interface between the light guide 110, other than at the emission points 210, and the photoresist 240.

The light source 230 is configured to emit photoresist-curative electromagnetic radiation. If the photoresist is UV curable, for example, the light source 230 would be configured to emit UV light. Alternatively, the photoresist may be visible light curable. The light source 230 may be the same as the light source 130 of the device in FIG. 1A. Alternatively, the light source 230 may be removed from the light guide 110 after exposing the photoresist 240 to photoresist-curative electromagnetic radiation, and subsequent replaced with the light source 130, which may emit light in a different wavelength range than the light source 230.

The emission points 210 may be light diffusing material. Alternatively, the emission points 210 may be light refracting. For example, the emission points 210 may be formed as lenses imprinted on a surface of the light guide 110.

The emission points 210 may be formed in any way to provide a frustration of total internal reflection at the emission points of the photoresist-curative electromagnetic radiation being guided in the light guide 110. The emission points 210 may be formed as a roughened surface of the light guide 110. In this regard the emission points 210 may be formed by etching or laser ablation, for example. The etching may be wet or dry etching, for example. The dry etching may be reactive ion etching for example. The emission points 210 may be formed as an implanted region on the surface of the light guide 110. For example, the surface of the light guide 110 may be implanted with metal ions. The emission points 210 may be formed as a deposited light diffusing region. For example, the emission points 210 may be formed by depositing a metal oxide on the light guide 110.

Figure 3:
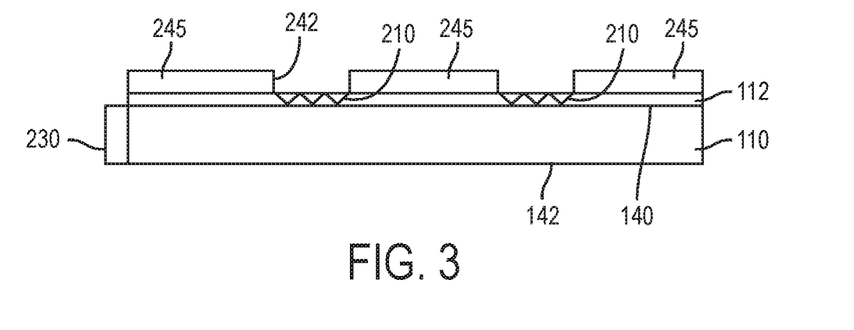
FIG. 3 is side view of a device providing emission of photo-curative electromagnetic radiation with emission points on a film on a light guide according to the inventive concepts disclosed herein.
Figure 4:
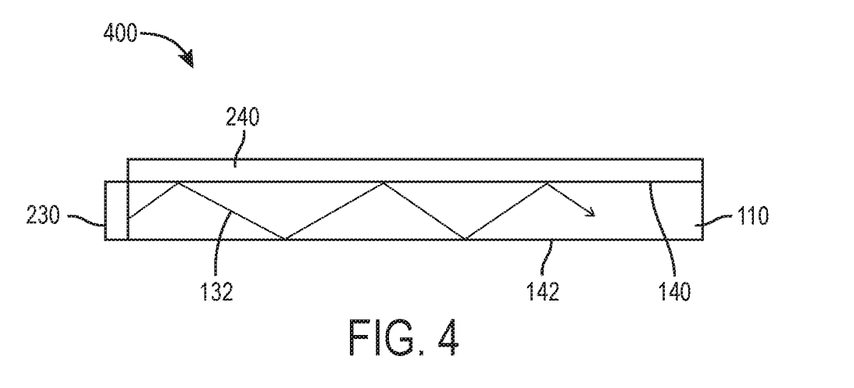
FIG. 4 is a comparative example of a device without emission points.
Figure 5:
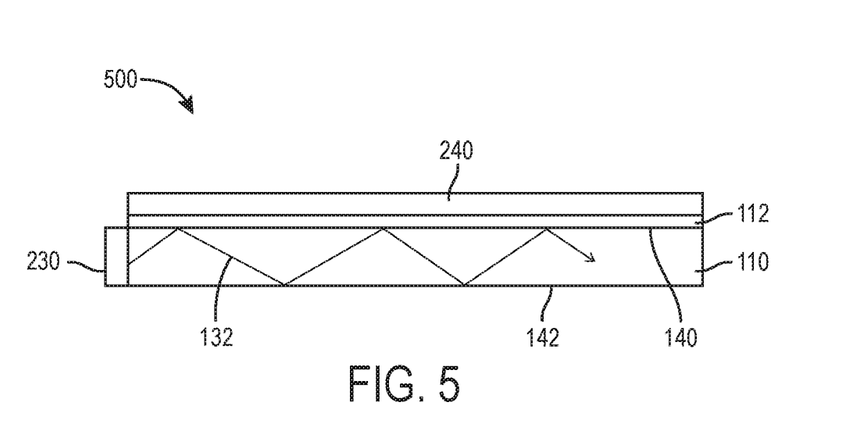
FIG. 5 is a comparative example of a device without emission points with a film on the light guide.

FIG. 3 illustrates a device 300 according to at least one embodiment. The at least one embodiment of FIG. 3 is similar to that of FIG. 2B, except that the light guide 110 has a film 112 formed on the light guide 110, where the emission points 210 are formed in the film 112. The photoresist 240 is then developed to form a patterned photoresist 245 as shown in FIG. 3, where the patterned photoresist 245 has a pattern of wells 242 formed in the patterned photoresist 245 exposing the light guide 110. The film 112 may have an index of refraction less than that of the light guide 110 so that the film 112 acts as an optical cladding to totally internally reflect the photoresist-curative electromagnetic radiation at the interface between the light guide 110, other than at the emission points 210, and the film 112. Thus, even if the photoresist does not function as an optical cladding, the film 112 may function as a cladding FIGS. 4 and 5 are comparative examples, corresponding to FIGS. 2B and 3, respectively, of devices which do not allow for frustration of total internal reflection in a light guide 110 at selected points. In particular, the device 400 of FIG. 4, and the device 500 of FIG. 5, do not have the emission points of FIGS. 2A and 3. Thus, a light ray 132 from the light source 230 is totally internally reflected along the entire light guide 100.

Figure 6:
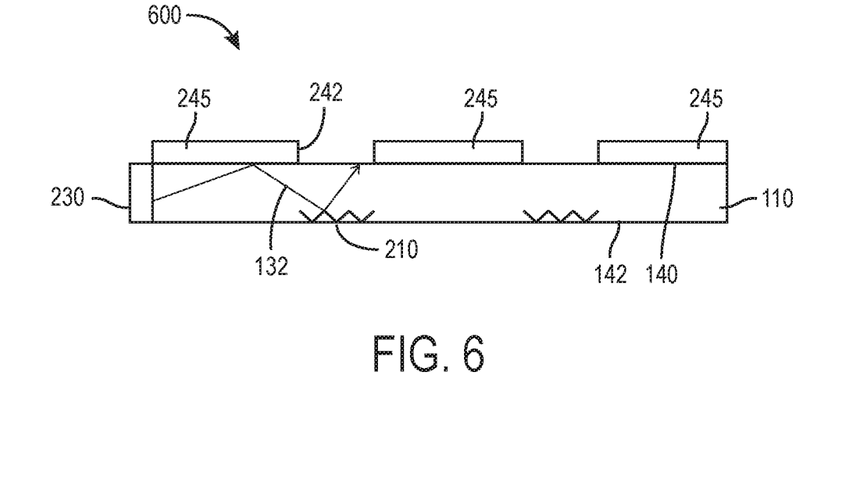
FIG. 6 is side view of a device providing emission of photo-curative electromagnetic radiation with emission points on a light guide bottom surface according to the inventive concepts disclosed herein.

FIG. 6 illustrates a device 600 according to at least one embodiment. The at least one embodiment of FIG. 6 is similar to that of FIG. 2B, except that in FIG. 2B the emission points 210 are formed on the front surface 140 (first surface) of the light guide 110 upon which the photoresist 240 is disposed, while in FIG. 6 the emission points 210 are formed on the back surface 142 (second surface) of the light guide 110 opposite to the front surface 140 (first surface) of the light guide 110 upon which the photoresist 240 is disposed.

The emission points 210 are of a material and geometry in FIG. 6 so that photoresist-curative electromagnetic radiation from the light source 230 is subject to frustration of total internal reflection at the emission points 210 and is directed back from the back surface 142 to the front surface 140 and exits the front surface 140 to impinge upon the photoresist 240. Subsequently, the photoresist is patterned to form a patterned photoresist 245 as shown in FIG. 6. The patterned photoresist 245 has a pattern of wells 242 formed in the patterned photoresist 245 exposing the light guide 110.

Figure 7:
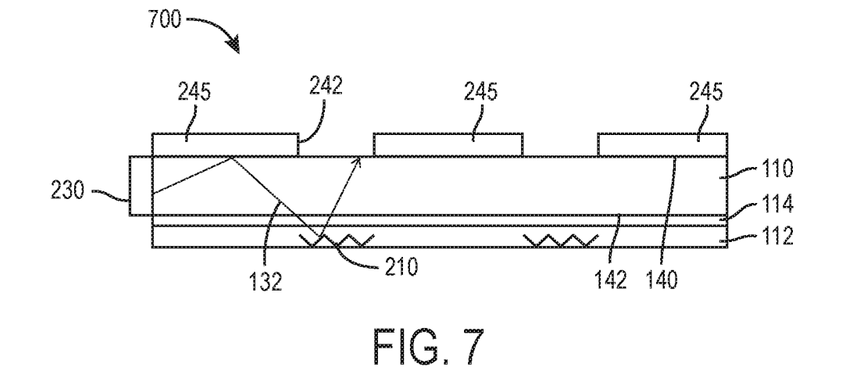
FIG. 7 is side view of a device providing emission of photo-curative electromagnetic radiation with emission points on a film on a light guide bottom surface according to the inventive concepts disclosed herein.

FIG. 7 illustrates a device 700 according to at least one embodiment. The at least one embodiment of FIG. 7 is similar to that of FIG. 3, except that in FIG. 3 the emission points 210 are formed on the film 112 on the front surface 140 (first surface) of the light guide 110 upon which the photoresist 240 is disposed, while in FIG. 7 the emission points 210 are formed on the film 112 on the back surface 142 (second surface) of the light guide 110 opposite to the front surface 140 (first surface) of the light guide 110 upon which the photoresist 240 is disposed.

The emission points 210 are of a material and geometry in FIG. 7 so that photoresist-curative electromagnetic radiation from the light source 230 is subject to frustration of total internal reflection at the emission points 210 and is directed back from the film 112 on the back surface 142 to the front surface 140, and exits the front surface 140 to impinge upon the photoresist 240. Subsequently, the photoresist is patterned to form a patterned photoresist 245 as shown in FIG. 7. The patterned photoresist 245 has a pattern of wells 242 formed in the patterned photoresist 245 exposing the light guide 110.

Further in FIG. 7 the film 112 may be adhered to the light guide 110 via an adhesive layer 114. Alternatively, the film 112 may directly contact the light guide 110.

Once the photoresist 240 is patterned into the patterned photoresist 245 according to any of the devices of FIG. 2B, 3, 6 or 7 to form the patterned photoresist 245 with a pattern of wells 242 formed in the patterned photoresist 245 exposing the light guide 110, further processing to form the device is performed. For example, the patterned photoresist 245 may be used to perform subsequent material deposition processes to form a light-manipulative material into the pattern of wells 242. Such processes include material deposition, nanoimprinting followed by nanoassembly, laser micro-machining followed by material deposition, and coating or plating processes.

For example, starting with the device of FIG. 2B with the patterned photoresist 245, the pattern of emission points 210 may be a light diffusing layer 124, such as shown in FIG. 1A. Alternatively, the light diffusion layer 124 may be formed at the pattern of emission points 210 using the patterned photoresist 245 as a mask, by etching, laser ablation, implantation, or diffusing film deposition. The deposition of the light diffusing layer 124 may be performed using any coating capable of producing a light diffusing layer within the well 242, including coatings that contain light diffusing particles/pigments and/or coatings in which the light diffusing layer 124 can be induced by subsequent light exposure, or other means, such as a photographic coating.

Figure 8:
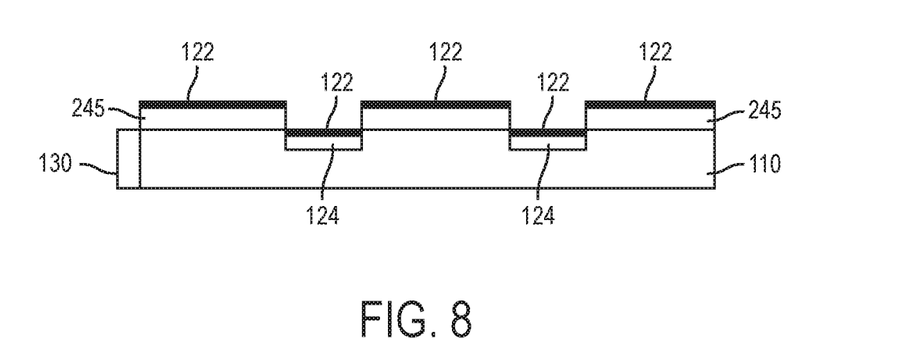
FIG. 8 is side view of an illuminating device with a reflecting film formed on a patterned photoresist illustrating a method step according to the inventive concepts disclosed herein.

Once the light diffusing layer 124 is formed, the light reflecting layer 122 may be formed on the light diffusing layer 124, such as, for example, as shown in FIG. 8. For example, the light reflecting layer 122 may be formed by deposition of a reflecting material on the light diffusing layer 124. The deposited reflecting material may be formed to contact the light diffusing layer 124 only at the pixel wells 242 where the light guide 110 is exposed by the patterned resist 240. Thus, the light reflecting layer 122 is formed on the light diffusing layer 124 only at the pixel wells 210.

The light reflecting layer 122 may be formed, for example, by sputter deposition of a metal. For example, Aluminum may be deposited as the light reflecting layer 122. An example of a light reflecting layer 122, capable of reflecting 99.99% of incidental light, would be 400 Angstroms of Aluminum applied by magnetron sputter coating.

Referring to FIG. 1A, following the deposition of the light reflecting layer 124 the remaining patterned photoresist 240 is stripped or lifted off from the surface of the light guide 110, for example, using a stripping agent that is compatible with the utilized photoresist.

The embodiments of the inventive concepts disclosed herein have been described in detail with particular reference to preferred embodiments thereof, but it will be understood by those skilled in the art that variations and modifications can be effected within the spirit and scope of the inventive concepts.

Embodiments of the inventive concepts disclosed herein have been described with reference to drawings. The drawings illustrate certain details of specific embodiments that implement systems and methods of the present disclosure. However, describing the embodiments with drawings should not be construed as imposing any limitations that may be present in the drawings.

The foregoing description of embodiments has been presented for the purposes of illustration and description. It is not intended to be exhaustive or to limit the subject matter to the precise form disclosed, and modifications and variations are possible in light of the above teachings or may be acquired from practice of the subject matter disclosed herein. The embodiments were chosen and described in order to explain the principals of the disclosed subject matter and its practical application to enable one skilled in the art to utilize the disclosed subject matter in various embodiments with various modification as are suited to the particular use contemplated. Other substitutions, modifications, changes and omissions may be made in the design, operating conditions and arrangement of the embodiments without departing from the scope of the presently disclosed subject matter.

What is claimed is:

1. A device comprising:
   a light source configured to emit photoresist-curative electromagnetic radiation; and
   a light guide arranged to receive the photoresist-curative electromagnetic radiation from the light source and to guide the received radiation by total internal reflection, the light guide including a pattern of emission points on at least one surface of the light guide, the emission points including a deposited light diffusing region adjacent the at least one surface, the emission points emitting the photoresist-curative electromagnetic radiation out of the light guide by frustration of total internal reflection caused by the emission points.

2. The device of claim 1, wherein the photoresist-curative electromagnetic radiation is ultraviolet (UV) light.

3. The device of claim 1, where the emission points comprise a light diffusing layer or a lens imprinted on the at least one surface of the light guide.

4. The device of claim 1, further including a photoresist disposed on a first surface of the light guide, the emission points formed on the first surface, wherein portions of the photoresist are cured by the photoresist-curative electromagnetic radiation emitted at the emission points.

5. The device of claim 4, wherein the photoresist has an index of refraction less than that of the light guide such that the photoresist acts as an optical cladding to totally internally reflect the photoresist-curative electromagnetic radiation at an interface between the light guide, other than at the emission points, and the photoresist.

6. The device of claim 1, wherein the emission points include a roughened surface of the at least one surface.

7. The device of claim 1, wherein the emission points include an implanted region of the at least one surface.

8. The device of claim 1, wherein the light source is arranged to inject the photoresist-curative electromagnetic radiation into an edge of the light guide.

9. The device of claim 1, further including a photoresist disposed on a first surface of the light guide, the emission points formed on a second surface of the light guide opposite to the first surface, wherein portions of the photoresist are cured by the photoresist-curative electromagnetic radiation emitted at the emission points.

10. The device of claim 1, wherein the deposited light diffusing region includes a metal oxide.

11. A device comprising:
    a light source configured to emit photoresist-curative electromagnetic radiation; and
    a light guide arranged to receive the photoresist-curative electromagnetic radiation from the light source and to guide the received radiation by total internal reflection, the light guide including a film on at least one surface of the light guide, the film having a pattern of emission points, the emission points including a deposited light diffusing region adjacent the film, the emission points emitting the photoresist-curative electromagnetic radiation out of the light guide by frustration of total internal reflection caused by the emission points.

12. The device of claim 11, wherein the film has an index of refraction less than that of the light guide such that the film acts as an optical cladding to totally internally reflect the photoresist-curative electromagnetic radiation at an interface between the film, other than at the emission points, and the film.

13. The device of claim 11, wherein the photoresist-curative electromagnetic radiation is ultraviolet (UV) light.

14. The device of claim 11, further including a photoresist disposed on a first surface of the light guide, the emission points formed on the film on the first surface, wherein portions of the photoresist are cured by the photoresist-curative electromagnetic radiation emitted at the emission points.

15. The device of claim 11, further including a photoresist disposed on a first surface of the light guide, the emission points formed on the film on a second surface of the light guide opposite to the first surface, wherein portions of the photoresist are cured by the photoresist-curative electromagnetic radiation emitted at the emission points.

16. The device of claim 11, wherein the light source is arranged to inject the photoresist-curative electromagnetic radiation into an edge of the light guide.

17. A method of exposing photoresist to photoresist-curative electromagnetic radiation, comprising:
    disposing the photoresist on a first surface of a light guide, at least one surface of the light guide having a pattern of emission points;
    injecting photoresist-curative electromagnetic radiation into the light guide such that the photoresist-curative electromagnetic radiation is guided within the light guide by total internal reflection, the emission points including a deposited light diffusing region adjacent the at least one surface, the emission points emitting the photoresist-curative electromagnetic radiation into the photoresist by frustration of total internal reflection caused by the emission points; and
    developing the photoresist to form a patterned photoresist.

18. The method of claim 17, wherein the photoresist-curative electromagnetic radiation is injected into an edge of the light guide.

19. The method of claim 17, wherein the photoresist-curative electromagnetic radiation is ultraviolet (UV) light.

* * * * *